United States Patent [19]

Ueno et al.

[11] 4,264,822
[45] Apr. 28, 1981

[54] ELECTRON BEAM TESTING METHOD AND APPARATUS OF MASK

[75] Inventors: Yukichi Ueno, Katsuta; Teiji Katsuta, Mito, both of Japan

[73] Assignee: Hitachi, Ltd., Tokyo, Japan

[21] Appl. No.: 96,390

[22] Filed: Nov. 21, 1979

[30] Foreign Application Priority Data

Nov. 27, 1978 [JP] Japan .................................. 53-146405

[51] Int. Cl.³ ............................................. A61K 27/02
[52] U.S. Cl. ................................ 250/492 A; 250/311; 250/399
[58] Field of Search ................ 250/492 A, 399, 492 R

[56] References Cited

U.S. PATENT DOCUMENTS

| | | | |
|---|---|---|---|
| 3,519,788 | 7/1970 | Hatzakis | 250/492 A |
| 3,875,414 | 4/1975 | Prior | 250/492 R |
| 3,876,883 | 4/1975 | Broers | 250/492 A |
| 4,119,854 | 10/1978 | Tanaka et al. | 250/398 |

*Primary Examiner*—Harold A. Dixon
*Attorney, Agent, or Firm*—Craig and Antonelli

[57] ABSTRACT

A method and an apparatus for testing a mask by an electron beam are disclosed in which the electron beam probe is first incident upon a predetermined point on a mask pattern of a photomask used to fabricate a semiconductor integrated circuit, the mask pattern is scanned by the electron beam probe from the predetermined point in a direction, the scanning operation is stopped when the electron beam probe reaches an edge of the mask pattern, the position of the edge or the distance between the predetermined point and the edge is determined by the number of pulse required to deflect the electron beam probe by a desired amount, and the position or distance thus determined is compared with the design data of the mask pattern to examine the dimensions of the mask pattern.

10 Claims, 3 Drawing Figures

POSITION OF ELECTRON PROBE

ELECTRON BEAM TESTING METHOD AND APPARATUS OF MASK

BACKGROUND OF THE INVENTION

The present invention relates to a method and an apparatus for testing a photomask which is used in fabricating a semiconductor device, by an electron beam probe.

A mask pattern on a photomask used for fabricating a large scale integration (hereinafter referred to as an LSI) becomes fine as the packing density of the LSI is made higher. Accordingly, a high dimensional accuracy and a high positional accuracy are required for the mask pattern.

In order to test such a fine mask pattern on the photomask with high accuracy, there have been proposed various electron beam testing apparatuses. As one of the above testing apparatuses, for example, a scanning electron microscope (hereinafter referred to as an SEM) is well known which is described on pages 37 to 45 of the SPIE, Vol. 100, Semiconductor Microlithography II, 1977.

In the above SEM, recoil electrons and secondary electrons, both of which result from the physical interaction between an electron beam probe and a photomask, are detected by a collector to generate signals having a waveform corresponding to the surface state of the photomask. The boundary between a mask pattern and the pattern-lacking region of the photomask is detected from the above signal waveform, and such positional information of the mask pattern as the width of pattern and the position of pattern is obtained by using the above boundary. It can be judged from the comparison between the positional information of mask pattern and design data of the photomask whether the mask pattern is fabricated in a satisfactory manner or not.

Now, the conventional method of detecting the width or position of a mask pattern on the basis of the signal waveform made by recoil or secondary electrons will be explained below in more detail by reference to FIGS. 2a and 2b of the accompanying drawings. In FIG. 2a, reference numeral 19 designates an opaque pattern which is formed on a glass substrate 18 through evaporation and is made of a metal such as chromium. FIG. 2b shows a signal waveform 60 delivered from an electron collector when the mask pattern 19 is scanned in the x-direction over a length $l'$ with the center at a specified position $x_p$. The signal waveform 60 is compared with a threshold level 61 for judging the boundary between the mask pattern and the pattern-lacking region of the photomask. When the intersecting points of the signal waveform 60 and the threshold level 61 are given by $x_1$ and $x_2$, respectively, the width $l$ of the mask pattern 19 can be expressed by the following equation:

$$l = x_2 - x_1.$$

Further, when the specified position $x_p$ is located at the center of the pattern, the X-coordinate $x_p$ of the specified position satisfies the following equation:

$$x_p = (x_1 + x_2)/2.$$

In the conventional testing method which has been explained in conjunction with FIGS. 2a and 2b, the photomask is scanned by the electron beam probe over a length $l'$ which is longer than a width $l$ of a mask pattern 19 to be tested. Accordingly, the transparent region of the photomask having no mask pattern is also irradiated with the electron beam, and floating hydrocarbons in the SEM adhere to that part of the transparent region of the mask which is subjected to the irradiation of electron beam. In other words, the irradiation of electron beam gives rise to contamination on the transparent region of the photomask. The number of contaminated points is increased as the scanning motion of the electron beam is carried out at a larger number of parts of the photomask for the purpose of enhancing the accuracy of test, and undesired, opaque patterns are formed on the photomask when the number of contaminated points is increased to a certain degree.

SUMMARY OF THE INVENTION

An object of the present invention is to provide electron beam testing method and apparatus which can avoid contamination on the transparent region of a photomask due to the irradiation of electron beam.

Another object of the present invention is to provide electron beam testing method and apparatus in which scan control means are employed to avoid contamination on the transparent region of a photomask due to the irradiation of electron beam.

A further object of the present invention is to provide electron beam testing method and apparatus in which the surface of a photomask can be scanned by an electron beam probe in a short time.

Still another object of the present invention is to provide electron beam testing method and apparatus in which the surface of a photomask can be linearly scanned by an electron beam probe in such a manner as avoiding contamination on the transparent region of a photomask due to the above scanning.

Still a further object of the present invention is to provide electron beam testing method and apparatus in which a photomask can be scanned by an electron beam probe in two directions perpendicular to each other in such a manner as avoiding contamination on the transparent region of the photomask due to the above scanning.

In order to attain the above objects, according to the present invention, a starting point from which a photomask is scanned by an electron beam probe, is selected in the opaque region of the photomask, and the scanning operation is stopped when the electron beam probe reaches an edge of the opaque region, that is, a boundary between the opaque and transparent regions of the photomask.

BRIEF DESCRIPTION OF THE DRAWING

FIG. 2a shows an example of a mask pattern formed of an evaporated metal film, and FIG. 2b shows a signal waveform obtained in scanning the mask pattern shown in FIG. 2a by an electron beam probe.

DESCRIPTION OF THE PREFERRED EMBODIMENT

Figure 1:
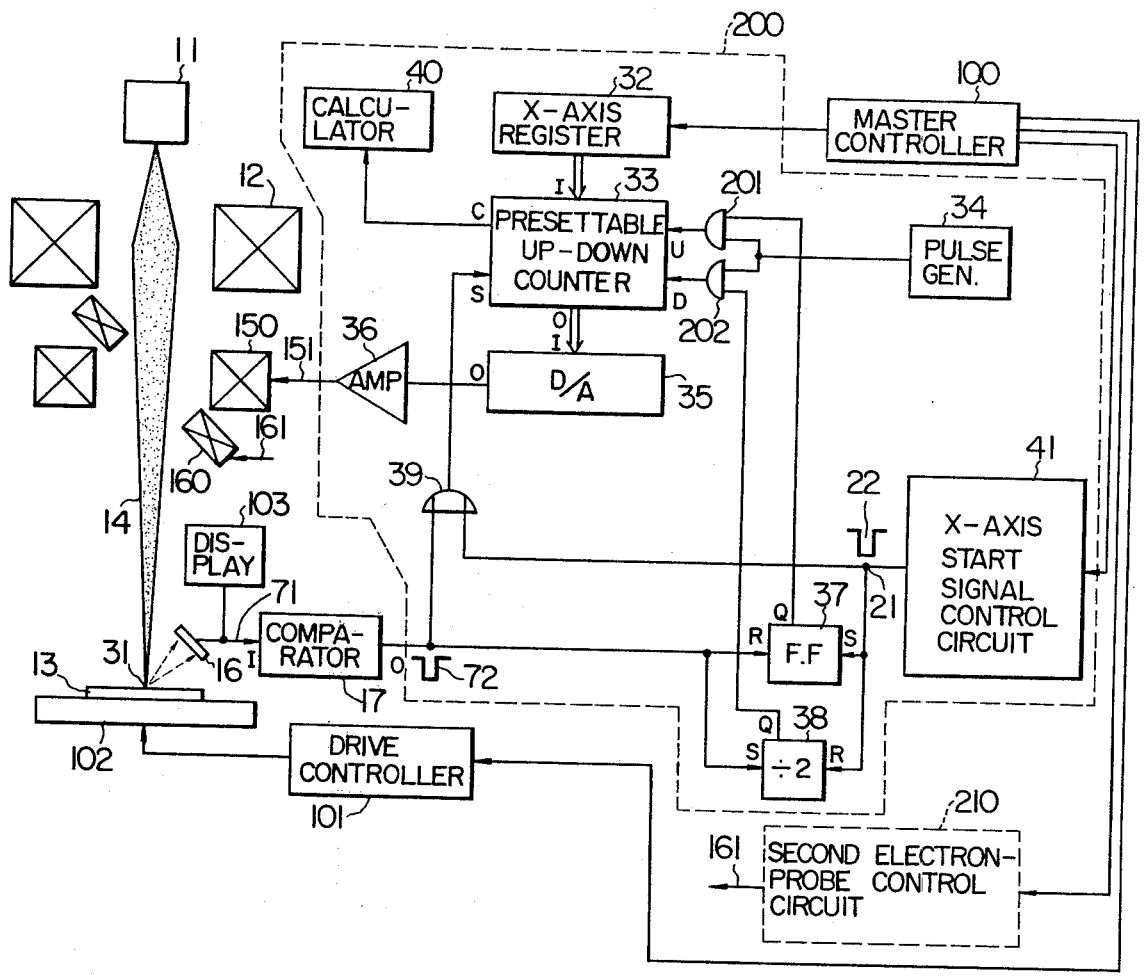
FIG. 1 is a block diagram of an embodiment of an electron beam testing apparatus of a mask according to the present invention.

Referring to FIG. 1 which shows an embodiment of an electron beam testing apparatus of a mask according to the present invention, an electron beam emitted from an electron gun 11 is focussed by a focussing lens 12 on the surface 31 of a mask 13 to form an electron beam probe 14. The electron beam probe 14 is deflected by means of a first beam deflector 150 to scan the mask surface 31. The first beam deflector 150 is made up of a pair of facing parts to deflect the electron beam probe 14 in a direction. Further, a second beam deflector 160 is provided which deflects the electron beam probe 14 in a direction perpendicular to that in the first beam deflector 150. Recoil or secondary electrons which are generated due to the physical interaction between the electron beam probe 14 and the mask surface 31, are detected by an electron collector 16 to produce electrical signals. The signals thus produced have intensities corresponding to the positions of the electron beam probe 14 on the mask surface 31. The waveform having such signal intensities is processed by a comparator 17 in a manner such as described later to detect a boundary between a mask pattern and the transparent region of the mask. Such information as the width and position of the mask pattern is obtained from the detected boundary, and it can be judged by comparing the above information with the design data of the mask 13 whether the mask pattern is formed on the mask surface 31 in a satisfactory manner or not.

The position of the electron beam probe 14 on the mask surface 31 in a scanning period is known from the deflection angle of the probe 14. A relation between the precise position of the probe 14 on the mask surface 14 and the deflection angle of the probe 14 has been previously determined by using an appropriate sample which is provided with a pattern having known dimensions.

The mask 13 is disposed at a predetermined position on a sample stage 102 which is movable in X- and Y- direction perpendicular to each other. The sample stage 102 is moved in the X- and Y-directions in accordance with the output of a drive controller 101 which is operated by an instruction from a master controller 100. The master controller 100 stores therein such information as the order of test in which a plurality of integrated circuit patterns (hereinafter referred to as IC patterns) on the mask 13 are tested, the origin of each of the IC patterns, the starting point in each scanning operation (for example, the point $x_p$ shown in FIG. 2a and a corresponding point $y_p$ on the Y-axis), and the indication as to whether each IC pattern should be tested with reference to the X-axis or with reference to the Y-axis. When the position of a pattern to be tested is located outside a scanning field of the SEM used, the sample stage 102 is moved by the output of the drive controller 101 under the control of the master controller 101 to place the pattern to be tested within the scanning field of the SEM. The master controller 101 has such functions as defining X- and Y- axes on the mask on the basis of an origin mark 50 provided on the surface of the mask, and as determining the position of the electron beam probe 14 relative to the origin mark 50. The above functions are achieved in the following manner. That is, the sample stage 102 is moved so as to place the origin mark 50 beneath the electron gun 11, and the origin mark 50 is detected by scanning the mask surface by the electron beam probe 14. Incidentally, a distance by which the sample stage 102 is moved, is measured by a laser measuring device (not shown).

Figure 2A:
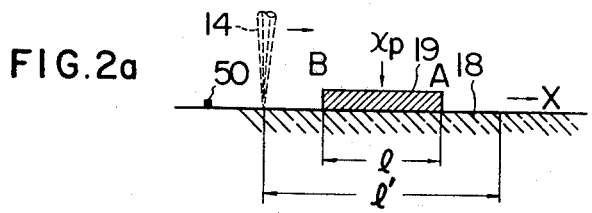
FIGS. 2a and 2b are views for explaining a conventional testing method and a testing method according to the present invention.

When the dimension test of an IC pattern is conducted with reference to the X-axis, a start signal 22 for instructing the start of scanning is supplied from the master controller 100 to various elements of a first control circuit 200, which controls the movement of the electron beam probe 14 on the X-axis, through an X-axis start signal control circuit 41. While, when the test is conducted with reference to the Y-axis, another start signal is supplied from the master controller 100 to various elements of a second control circuit 210 for controlling the movement of the electron beam probe 14 on the Y-axis, through a Y-axis start signal control circuit which is not shown in FIG. 1 but has the same circuit construction as the X-axis start signal control circuit 41. Simultaneously with the application of the start signal 22 to a terminal 21, data with respect to a starting point of scanning which corresponds to $x_p$ in FIG. 2a, are inputted into an X-axis register 32. While, when the test is conducted in the direction of Y-axis, data with respect to a starting point which corresponds to the previously-mentioned $y_p$, are inputted into a Y-axis register which is included in the second control circuit 210 and has the same circuit construction as the X-axis register 32.

The start signal 22 on the terminal 21 is sent through an OR gate 39 to the set terminal S of a presettable up-down counter 33 to set the data of the X-axis register 32 into the up-down counter 33. Simultaneously, the start signal 22 is applied to the set terminal S of an RS-type flip flop 37 to set the flip flop 37. Then, the output signal delivered from the output terminal Q of the flip flop 37 enables an AND gate 201. The start signal 22 is also applied to the reset terminal R of a ½ counter 38 to reset the counter 38. The output signal of the counter 38 disables an AND gate 202. When the AND gate 201 is enabled, the output pulse of a pulse generator 34 is applied to one input terminal U of the presettable up-down counter 33 through the AND gate 201, and thus 1 (one) is added to the data having been set in the counter 33 every time the counter 33 receives the output signal of the pulse generator 34. The output terminal O of the preset-table up-down counter 33 is connected to the input terminal I of a D-A converter 35, which delivers from its output terminal O an output voltage proportional to the output data of the presettable up-down counter 33. The output voltage is supplied to the first beam deflector 150 through an amplifier 36 to deflect the electron beam probe 14. Accordingly, the electron beam probe 14 is deflected by an amount corresponding to the sum of the data stored in the X-axis register 32 and the number of pulses which are supplied from the pulse generator 34 and taken in by the counter 33.

Figure 2B:
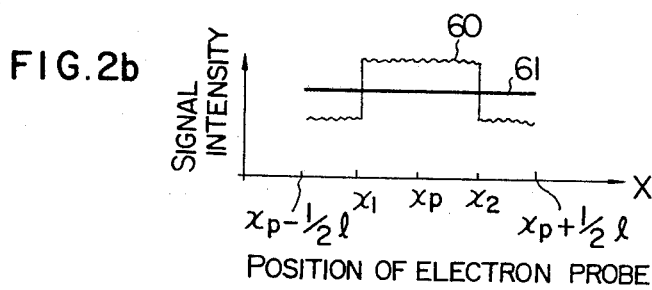

While, the signal waveform corresponding to the scanning motion of the electron beam probe 14 is supplied from the electron collector 16 to the comparator 17 through an input line 71. Further, the signal waveform is displayed by a display device 102 connected to the electron collector 16. The comparator 17 compares the threshold level 61 shown in FIG. 2b with the signal waveform 60 from the electron collector 16, and delivers a coincidence pulse 72 when the electron beam probe 14 reaches the boundary between the opaque and transparent regions 19 and 18 of the mask 13, that is, when the electron beam probe 14 impinges upon the point A shown in FIG. 2a.

The coincidence pulse 72 is applied through the OR gate 39 to the set terminal S of the presettable up-down counter 33 to reset the contents of the counter 33 to the original data which were supplied from the X-axis register 32. The coincidence pulse 72 is also applied to the input terminal S of the ½ counter 38. Since the output of the counter 38 is inverted in polarity every time the counter 38 is applied with an input pulse, the counter 38 delivers an output of an inverted polarity upon receipt of the coincidence pulse to thereby enable the AND gate 202. When the AND gate 202 is enabled, the output pulse of the pulse generator 34 is applied through the AND gate 202 to the other input terminal D of the presettable up-down counter 33. Thus, 1 (one) is subtracted from the data having been set in the counter 33 every time the counter 33 receives the output pulse of the pulse generator 34. Accordingly, in this case, the electron beam probe 14 is deflected in the opposite direction. When the electron beam probe 14 is deflected to another boundary (a point B shown in FIG. 2a) between the opaque and transparent regions 19 and 18 of the mask 13, where the intensity of the signal delivered from the electron detector 16 becomes equal to the threshold level 61, the comparator 17 delivers the coincidence pulse 72, which again inverts the polarity of the output of the ½ counter 38 to disable the AND gate 202. This coincidence pulse 72 is also applied to the presettable up-down counter 33 to reset the contents of the counter 33 to the original data which were supplied from the X-axis register 32. The original data which indicate the starting point of the scanning operation, are sent from the presettable up-down counter 33 to the first beam deflector 150 through the D-A converter 35 and amplifier 36 to restore the electron beam probe 14 to the starting point $x_p$ on the mask 13.

Referring to FIG. 2a, when the position of the point $x_p$ is known from the design data and the position of the point A is determined to know the dimensions of the pattern 19 on the mask 13, the following operation is performed. In this case, however a presettable counter may be used in place of the presettable up-down counter 33, since the scanning operation is performed in only the direction from the point $x_p$ to the point A. Further, in this case, the ½ counter 38 can be dispensed with, since the count-down operation is never conducted. A calculator 40 connected to the presettable up-down counter 33 calculates the position of the point A on the basis of the contents of the counter 33, and further calculates the distance between the points $x_p$ and A. Incidentally, for example, an SN74193-type IC manufactured by the Texas Instrument Co. may be used as the presettable up-down counter 33.

Needless to say, the calculator 40 can calculate the coordinate of the point B and the distance l between the points A and B.

In a case where the scanning operation is performed on the Y-axis after the X-axis scanning operation has been completed in order to test the dimensions of the pattern 19 in the X- and Y-directions, the following operation is performed in the circuit arrangement shown in FIG. 1. After the coincidence pulse 72 has been twice delivered from the comparator 17, that is, after the points A and B have been scanned, the second control circuit 210 which has the same circuit arrangement as the first control circuit 200, is operated by a scan instruction from the master controller 100. The output 161 of the second control circuit 210 is applied to the second beam deflector 160 to deflect the electron beam probe 14 in the Y-direction.

As is evident from the foregoing description, according to the present invention, the irradiation of the transparent region of a mask with an electron beam probe can be prevented or minimized. Therefore, the present invention is effective in avoiding contamination on a mask due to irradiation of an electron beam.

What is claimed is:

1. An electron beam testing method of a mask in which a mask pattern formed on the surface of said mask is scanned by an electron beam probe to examine the dimensions of said mask pattern, comprising the steps of:
   defining a coordinate on said mask on the basis of an origin mark provided on said mask to adjust the position of said electron beam probe relative to said origin mark;
   defining a starting point of scanning at a position on said mask pattern, said position being spaced apart from the said origin mark by a predetermined distance; and
   scanning said mask pattern from said starting point by said electron beam probe in one direction to conduct a first scan, and stopping said first scan upon arrival of said electron beam probe at a first edge of said mask pattern.

2. An electron beam testing method of a mask according to claim 1 further comprising the steps of:
   restoring said electron beam probe to said starting point of scanning after arrival of said electron beam probe at said first edge; and
   scanning said mask pattern by said electron beam probe in a direction opposite to said one direction to conduct a second scan, and stopping said second scan upon arrival of said electron beam probe at a second edge of said mask pattern.

3. An electron beam testing method of a mask according to claim 1 further comprising the steps of:
   restoring said electron beam probe to said starting point of scanning after arrival of said electron beam probe at said first edge; and
   scanning said mask pattern by said electron beam probe in the other direction perpendicular to said one direction to conduct a third scan, and stopping said third scan upon arrival of said electron beam probe at a third edge of said mask pattern.

4. An electron beam testing method of a mask according to claim 1 further comprising the steps of:
   restoring said electron beam probe to said starting point of scanning after arrival of said electron beam probe at said first edge;
   scanning said mask pattern by said electron beam probe in the other direction perpendicular to said one direction to conduct a third scan, and stopping said third scan upon arrival of said electron beam probe at a third edge of said mask pattern;
   restoring said electron beam probe to said starting point of scanning; and
   scanning said mask pattern by said electron beam probe in a direction opposite to said other direction to conduct a fourth scan, and stopping said fourth scan upon arrival of said electron beam probe at a fourth edge of said mask pattern.

5. An electron beam testing method of a mask according to claim 1, 2, 3, or 4 further comprising the step of measuring the position of said first, second, third, or fourth edge, the distance between said starting point of scanning and said first edge, the distance between said first and second edges, or the distance between said third and fourth edges, said measurement being made on the basis of a scanning distance of said electron beam probe corrresponding to arrival of said electron beam probe at said first, second, third, or fourth edge of said mask pattern.

6. An electron beam testing apparatus of a mask including a first beam deflector for deflecting an electron beam probe to scan a mask pattern on the surface of a mask by said electron beam probe, a detector for detecting an output emitted from said surface of said mask due to the irradiation of said surface with said electron beam probe, and a comparator for detecting an edge of said mask pattern based upon the waveform of the output signal of said detector, which comprises:

means for adjusting a starting point of scanning, said starting point being defined on said mask pattern and spaced apart from an origin mark by a predetermined distance, said origin mark being provided on said surface of said mask, the position of said mask being adjusted to permit incidence of said electron beam probe upon said starting point; and a first control circuit for controlling the deflection angle of said electron beam probe given by said first beam deflector, said first control circuit scanning said mask pattern from said starting point by said electron beam in one direction to conduct a first scan, said first control circuit having such functions as judging arrival of said electron beam probe at a first edge of said mask pattern by the output of said comparator, and as stopping said first scan by said output of said comparator.

7. An electron beam testing apparatus of a mask according to claim 6, wherein said first control circuit includes means for scanning said mask pattern by said electron beam probe in a direction opposite to said one direction after arrival of said electron beam probe at said first edge to conduct a second scan, for judging arrival of said electron beam probe at a second edge of said mask pattern by the output of said comparator, and for stopping said second scan by said output of said comparator.

8. An electron beam testing apparatus of a mask including a first beam deflector for deflecting an electron beam probe in one direction to scan a mask pattern on the surface of a mask by said electron beam probe in said one direction, an second beam deflector for deflecting said electron beam probe in the other direction perpendicular to said one direction to scan said mask pattern by said electron beam probe in said other direction, a detector for detecting an output emitted from said surface of said mask due to the irradiation of said surface with said electron beam probe, and a comparator for detecting an edge of said mask pattern based upon the waveform of the output signal of said detector, which comprises:

means for adjusting a starting point of scanning, said starting point being defined on said mask pattern and spaced apart from an origin mark by a predetermined distance, said origin mark being provided on said surface of said mask, the position of said mask being adjusted to permit incidence of said electron beam probe upon said starting point;

a first control circuit for controlling the deflection angle of said electron beam probe given by said first beam deflector, said first control circuit scanning said mask pattern from said starting point by said electron beam probe in said one direction to conduct a first scan, said first control circuit having such functions as judging arrival of said electron beam probe at a first edge of said mask pattern by the output of said comparator, and as stopping said first scan by said output of said comparator, said first control unit then scanning said mask pattern by said electron beam probe in a direction opposite to said one direction to conduct a second scan, said first control circuit further having such functions as judging arrival of said electron beam probe at a second edge of said mask pattern from the output of said comparator, as stopping said second scan by said output of said comparator, and as restoring said electron beam probe to said starting point; and a second control circuit for controlling the deflection angle of said electron beam probe given by said second beam deflector, said second control circuit scanning said mask pattern by said electron beam probe in said other direction perpendicular to said one direction to conduct a third scan, said second control unit having such functions as judging arrival of said electron beam probe at a third edge by the output of said comparator, and as stopping said third scan by said output of said comparator.

9. An electron beam testing apparatus of a mask according to claim 8, wherein said second control circuit includes means for scanning said mask pattern by said electron beam probe in a direction opposite to said other direction after arrival of said electron beam probe at said third edge to conduct a fourth scan, for judging arrival of said electron beam probe at a fourth edge of said mask pattern by the output of said comparator, and for stopping said fourth scan by said output of said comparator.

10. An electron beam testing apparatus of a mask according to claim 6, 7, 8, or 9 further comprising a calculator for calculating a scanning distance of said electron beam probe on the basis of the output of said first or second control circuit, and for calculating the position of said first, second third, or fourth edge, the distance between said starting point of scanning and said first edge, the distance between said first and second edges, or the distance between said third and fourth edges.

* * * * *